United States Patent [19]
Lin et al.

[11] Patent Number: 5,668,026
[45] Date of Patent: Sep. 16, 1997

[54] DMOS FABRICATION PROCESS IMPLEMENTED WITH REDUCED NUMBER OF MASKS

[75] Inventors: True-Lon Lin, Cupertino; Fwu-Iuan Hshieh, Saratoga; Danny Chi Nim, San Jose; Koon Chong So, Santa Clara; Yan Man Tsui, Union City, all of Calif.

[73] Assignee: MegaMOS Corporation, San Jose, Calif.

[21] Appl. No.: 611,745

[22] Filed: Mar. 6, 1996

[51] Int. Cl.[6] ............................................. H01L 21/265
[52] U.S. Cl. ................................................... 438/272
[58] Field of Search ............................ 437/40, 41, 154, 437/228; 257/335

[56] References Cited

U.S. PATENT DOCUMENTS

| | | | |
|---|---|---|---|
| 4,626,293 | 12/1986 | Schols | 257/335 |
| 4,845,051 | 7/1989 | Cogan et al. | 437/228 |
| 4,914,058 | 4/1990 | Blanchard | 437/41 DM |
| 5,288,653 | 2/1994 | Enjoh | 437/41 DM |
| 5,298,442 | 3/1994 | Bulucea et al. | 437/40 |
| 5,567,634 | 10/1996 | Herbert et al. | 437/41 |

*Primary Examiner*—Jey Tsai
*Assistant Examiner*—Michael S. Lebentritt
*Attorney, Agent, or Firm*—Bo-In Lin

[57] ABSTRACT

A new DMOS fabrication process is disclosed. The fabrication process includes the steps of (a) growing an oxide layer on the substrate; (b) applying a first mask to define an active area and for selectively patterning the oxide layer for keeping a plurality of source implant blocking stumps near a plurality source regions wherein the blocking stumps being formed with width greater than twice a diffusion length of a source dopant and with width less than twice a diffusion length of the body dopant whereby the body regions merging together in the body diffusion becoming a single body region underneath the blocking stumps; (c) applying a second mask for forming a plurality of gates covering a portion of areas between the blocking stumps defining an implant window; (d) implanting a body dopant through the implant window followed by a body diffusion for forming a body region underneath the blocking stumps; (e) implanting the source dopant through the implant window over the source implant blocking stumps following by a source diffusion for forming separate source regions underneath the blocking stumps; (f) depositing an insulating dielectric BPSG/PSG layer; (g) employing a contact mask for etching through the insulating dielectric BPSG/PSG layer and the source implant blocking stumps to define contact windows; (h) depositing a metal layer to form a contact layer through the contact window; and (i) patterning the metal layer with a metal contact to define a plurality of contacts whereby the transistor is fabricated with a four masks process.

7 Claims, 12 Drawing Sheets

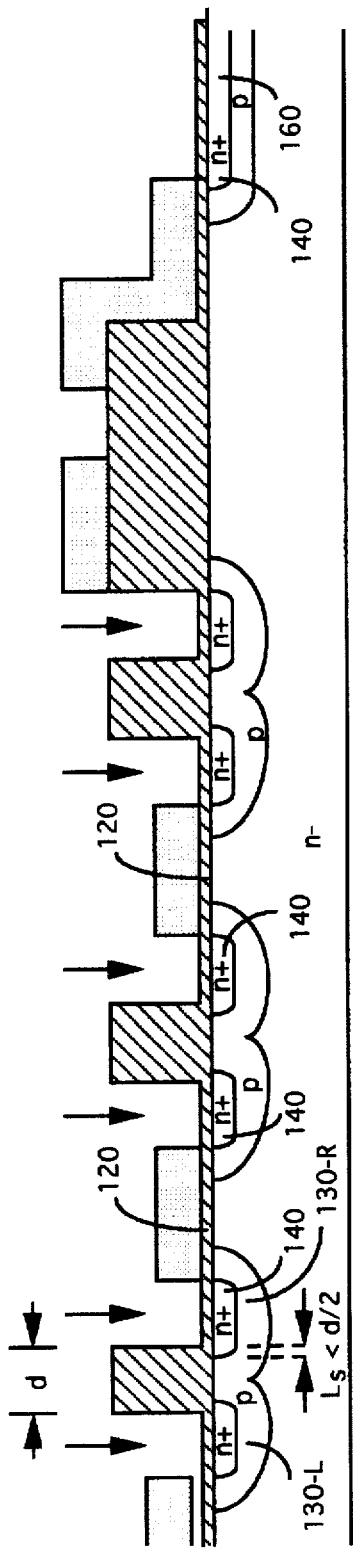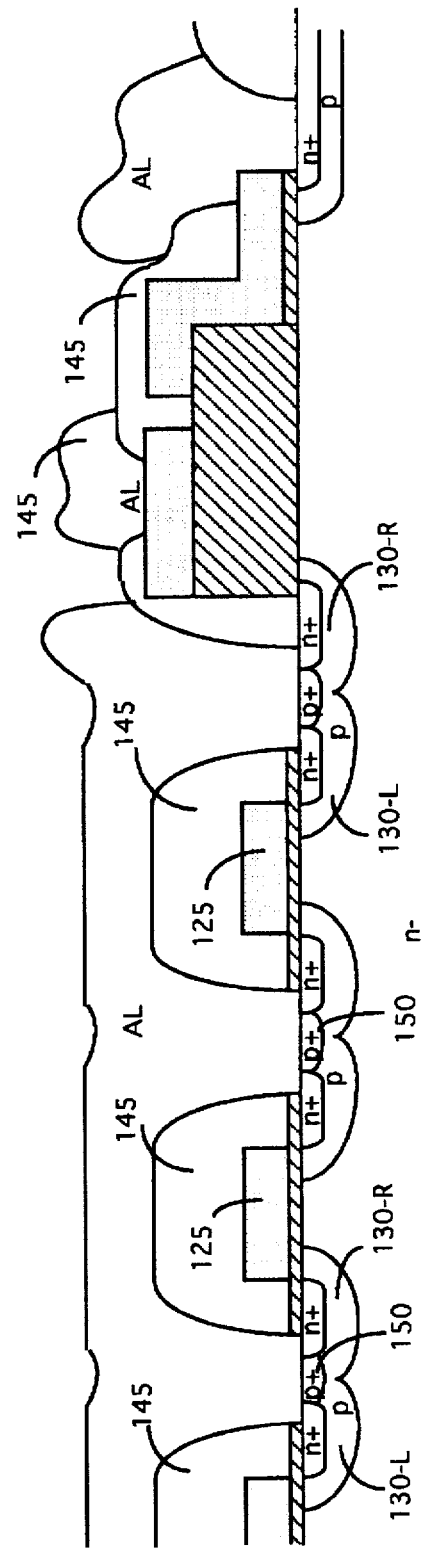

DMOS FABRICATION PROCESS IMPLEMENTED WITH REDUCED NUMBER OF MASKS

BACKGROUND OF THE INVENTION

1. Field of the Invention

This invention relates generally to the structure and fabrication process of trenched DMOS transistors. More particularly, this invention relates to a novel and improved DMOS structure and fabrication process wherein reduced number of masks are employed such that the DMOS devices can be manufactured at lower cost.

2. Description of the Prior Art

The fabrication cost of a semiconductor device is often adversely affected due to an increase in the number of masks required in the fabrication process. The fabrication cost for a double-diffusion metal oxide semiconductor (DMOS) device is kept at a relative high level when applying the conventional fabrication methods. The more rigid cost structure for DMOS fabrication is due to the technical difficulty that the number of masks required in device fabrication cannot be easily reduced. Cost reduction in DMOS fabrication is therefore not achievable when the required number of masks remains unchanged.

In addition to the consideration of fabrication costs, the production yield is increased when the number of masks employed in the fabrication process is reduced. A simplified fabrication process with less masks generally reduces the uncertainties and uncontrollable factors during fabrication and leads to yield rate improvement. Again, in the conventional DMOS fabrication techniques, simplified fabrication process with reduction of mask requirements is not easily achievable and yield improvement is still a goal beyond reach.

The number of masks required in DMOS fabrication is closely related to the structure of a DMOS transistor. Please refer to FIGS. 1A and 1B for a general device structure of a planar DMOS transistor 10 and 10' respectively where a cross-sectional views of typical DMOS cells 10 and 10' in the core cell region are shown. The DMOS transistor is supported on a N+ substrate 15 and an N–epi-taxial layer 20 formed on its top. The cell 10 includes a deep $p^+$-body region 25, a shallow p body 26, a source region 30 wherein the source region 30 and the p-body region 26 surround a gate 40 insulated by a gate oxide layer 35. The DMOS cell 10 is then covered with a PSG or BPSG protection layer 45. A contact 50 is then formed on top of the source region 30. The DMOS structures as shown for both the planar and trenched DMOS require that the source regions 30 be shorted to the body 25 where a channel is formed for conducting a source-to-drain current. This general structural feature imposes the following basic requirements on the fabrication processes:

(1) The deep $p^+$ regions 25 and the p-body regions 26 are usually formed prior to the rotation of the source regions 30; and (2) Subsequent to the formation of the p-body region 26, the source regions 30 are then formed, with a different geometrical profile, within the p-body regions 26.

Due to the facts that the source regions 30 are formed with different geometrical profile in the p-body region 26, in a conventional DMOS fabrication process, two separate masks are usually applied to form the deep $p^+$ regions 25 and the source regions. Several technical approaches are applied in the prior art as described below with some of these techniques employed to reduce the number of masks required in DMOS fabrication by eliminating the requirement for a separate mask for source implant. However, as will be further explained below, these prior art techniques for DMOS fabrication, even with reduced number of masks, are still limited by other technical difficulties.

FIG. 2 depicts a typical prior art approach used to form the source regions 30 in a p-body region 26. A source mask is applied to form a plurality of photoresist blocks 55 above the source regions 30. A source implant with ion beam 60 is then carried out. Part of the ion beam is blocked by the photoresist blocks 55 in forming the source regions 30. Due to the fact that in this traditional fabrication process, a separate source mask is required to form the source block 55, many invention disclosed in several US Patents provide new approaches to eliminate the use of this separate source mask.

In a U.S. Pat. No. 4,443,931, entitled "Method of Fabricating a Semiconductor Device with a Base Region Having a Deep Portion" (issued on Apr. 24, 1984), Baliga et al. disclose a MOSFET device. The MOSFET device is fabricated by depositing a LPCVD nitride layer after the poly gate is etched. A $p^+$ mask is applied to open a $p^+$-diffusion window. A p-type dopant is then diffused through the $p^+$ diffusion window. A thick oxide layer is then thermally grown over the $p^+$ diffusion window. An active mask is applied to selective etch the initial oxide layer. Because the oxide layer grown over the $p^+$ diffusion window has a greater thickness, an oxide plug is left covering a portion of the $p^+$-diffusion window after the etching process. The oxide plug is then applied as a block for source implant. This method is limited by the difficulty that the transistor cannot be shrunk due to a consideration that the deep $p^+$ region may encroach the channel when the core cells are fabricated with reduced dimension. The fabrication technique is also practically limited in its usefulness due to the more complicate processes.

In another patent, Baliga et al. in U.S. Pat. No. 4,567,641 entitled "Method of Fabricating Semiconductor Devices Having A Diffused Region of Reduced Length" disclose a method of fabricating a semiconductor device where the requirement of a source blocking mask is eliminated. The processing steps are shown in FIGS. 3A to 3D. (FIGS. 4A to 4D in B's Patent). In FIG. 3A, a semiconductor body 200, e.g., a silicon wafer, includes a substrate 202 constituting an N-drain and a N-region 204. On the upper surface 205 of the body 200, an insulating layer 206 is formed followed by deposition of a layer 208 composed of a conductive refractory material on the insulating layer 206. Another insulating layer of silicon oxide is grown on top of the refractory layer 208. Finally, a layer 211 composed of aluminum oxide is deposited on top of the oxide layer 210. A photolithography process is then employed to produce a mask 216 as that shown in FIG. 3B which defines a window 217 and serves as a diffusion barrier when a P-type diffusion through the window 217 is made to form the P base 218.

In FIG. 3C, A N+ diffusion is made through the window 217 to form a N+ source region 220 which extends laterally beneath the refractory layer 208 thus forming a region 222 with the lateral diffusion distance approximately the same distance diffused in the downward vertical direction. The diffusion of the N+ region occurs at an elevated temperature in an oxidizing atmosphere. As a result, the exposed surface 219 (shown in FIG. 3B) becomes oxidized and forming an oxide layer 221. In FIG. 3D, an anisotropic etchant to the oxide layer 221 through the window 217 is applied. This etchant etches through the oxide layer 221 substantially all the way through the N+ region 220 while allows the shoulder 223 of the N+ source 220 to remain intact. Specifically, the anisotropic etchant can be a vertically collimated-beam of reactive ions or a planar plasma etchant and forms a generally U-shaped groove 224. Alternatively, a V-shaped groove could be formed. Thus the source regions 220 are formed in the P base region 218 without requiring the use of a source mask.

The semiconductor device disclosed by Baliga et al., in U.S. Pat. No. 4,567,641, is limited by the fact that the DMOS fabrication process as disclosed involves a more complicate procedure where anisotropic etch is to be performed to etch a groove through multiple layer of insulative and refractory materials. Such procedure is more difficult to perform and therefore more costly. The device by Baliga et al. has another technical limitation that the contact-resistance is relative high due to a reduction of $n^+$ contact area when the U-shape groove is formed in the P region 218. For those reasons, even that the fabrication procedure disclosed by Baliga et al. is able to eliminated the mask used for source implant, does not provide an effective device fabrication method due to its higher contact-resistance and more complicated fabrication procedures.

Therefore, there is still a need in the art of power device fabrication, particularly for DMOS design and fabrication, to provide a structure and fabrication process that would resolve these difficulties.

SUMMARY OF THE PRESENT INVENTION

It is therefore an object of the present invention to provide a new DMOS fabrication process to enable those of ordinary skill in the art of DMOS fabrication to reduce the number of masks such that the aforementioned limitations as encountered in the prior art can be overcome.

Specifically, it is an object of the present invention to provide an improved DMOS fabrication process wherein the requirement of applying a separate masks specifically for forming the source regions and p+ regions are eliminated such that the number of masks required to fabricate a DMOS transistor can be reduced.

Another object of the present invention is to provide an improved DMOS fabrication process wherein an active mask for patterning the initial oxide layer is specially configured to form a plurality of source implant blocking stumps above the surface areas near the source regions for the purpose of eliminating the mask requirement in performing the source implant.

Another object of the present invention is to provide an improved DMOS fabrication process wherein the source implant blocking stumps patterned by the use of an active mask is specially designed to have an appropriate width less than twice the diffusion length of the body dopants while greater than twice the diffusion length of the source dopants such that a body-merge can take place in body diffusion process to form an integral body underneath the source-block stumps while the source regions will not be merged underneath the blocking stumps during diffusion whereby the source regions can be formed with appropriate geometrical profile in the body regions.

Another object of the present invention is to provide an improved DMOS fabrication process where a simplified fabrication method is employed by reducing the number of masks thus reducing the cost of manufacture and meanwhile increasing the production yield-rate for DMOS fabrication.

Briefly, in a preferred embodiment, the present invention includes a DMOS fabrication process for fabricating a DMOS transistor on a substrate. The fabrication process includes the steps of (a) growing an oxide layer on the substrate; (b) applying a first mask for removing the oxide layer to define an active area and for selectively patterning the oxide layer for keeping a plurality of source implant blocking stumps near a plurality source regions in the substrate wherein the blocking stumps being formed with width greater than twice a diffusion length of a source dopant and with width less than twice a diffusion length of the body dopant whereby the body regions merging together in the body diffusion and becoming a single body region underneath the blocking stumps; (c) applying a second mask for forming a plurality of gates covering a portion of areas between the blocking stumps thus defining an implant window; (d) implanting a body dopant through the implant window followed by a body diffusion for forming a body region underneath the blocking stumps; (d) implanting the source dopant through the implant window over the source implant blocking stumps following by a source diffusion for forming separate source regions underneath the blocking stumps; (e) removing the source implant blocking stumps from the implant window; (f) depositing an insulating dielectric BPSG/PSG layer; (g) employing a contact mask for etching through the insulating dielectric BPSG/PSG layer to define contact windows; (h) depositing a metal layer to form a contact layer through the contact window; and (i) patterning the metal layer with a metal contact to define a plurality of contacts whereby the DMOS transistor is fabricated with a four masks process.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 4A to 4D show the processing steps for manufacturing a planar DMOS device of the present invention.

DETAILED DESCRIPTION OF THE PREFERRED EMBODIMENT

A novel DMOS fabrication process is disclosed in this invention wherein a mask required for source implant in a conventional fabrication method is eliminated. This is achieved by applying a specially shaped active mask in patterning the field oxide to leave a plurality of thick oxide pads as implant blocking stumps. These thick oxide pads are then employed as blocks for source implant thus eliminating the requirement of a mask for forming the source blocks before the performance of a source implant. The oxide pads are then subsequently etched and removed. Detail processing steps for this novel DMOS fabrication process are described below.

Figure 1A:
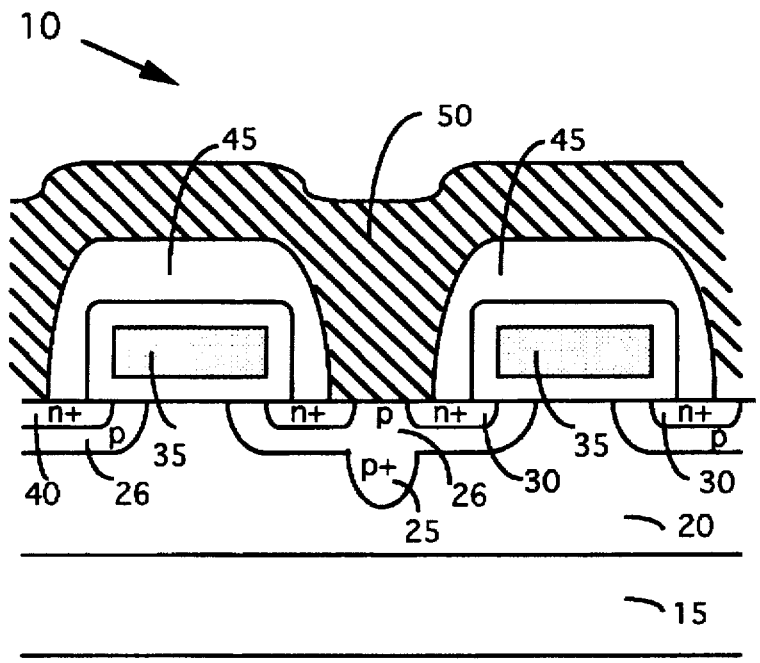
FIGS. 1A and 1B are a cross-sectional views of a prior art planar and trenched DMOS transistor respectively.
Figure 1B:
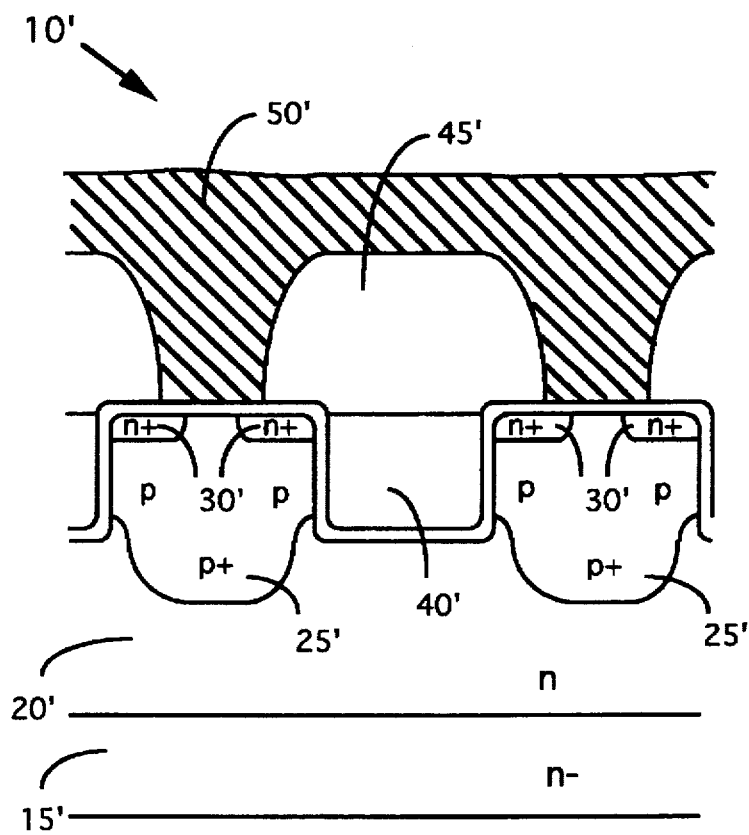
Figure 2:
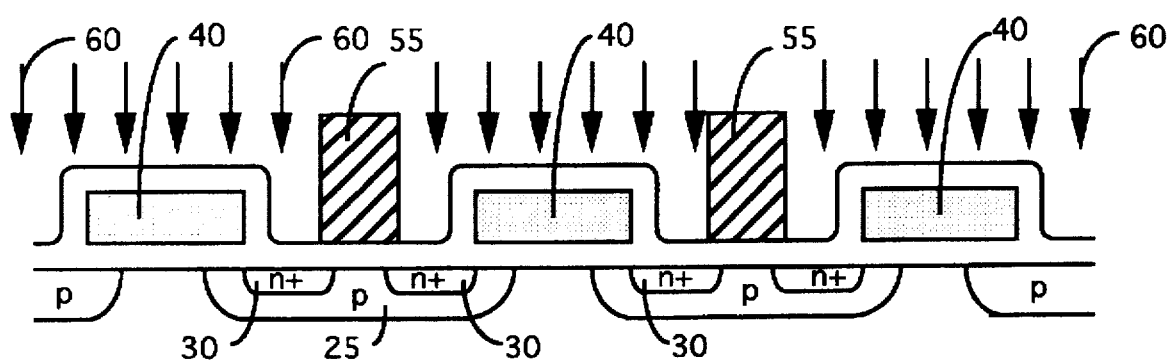
FIG. 2 is a cross sectional view to show a conventional fabrication process applying a source block to implant the source regions.
Figure 3A:
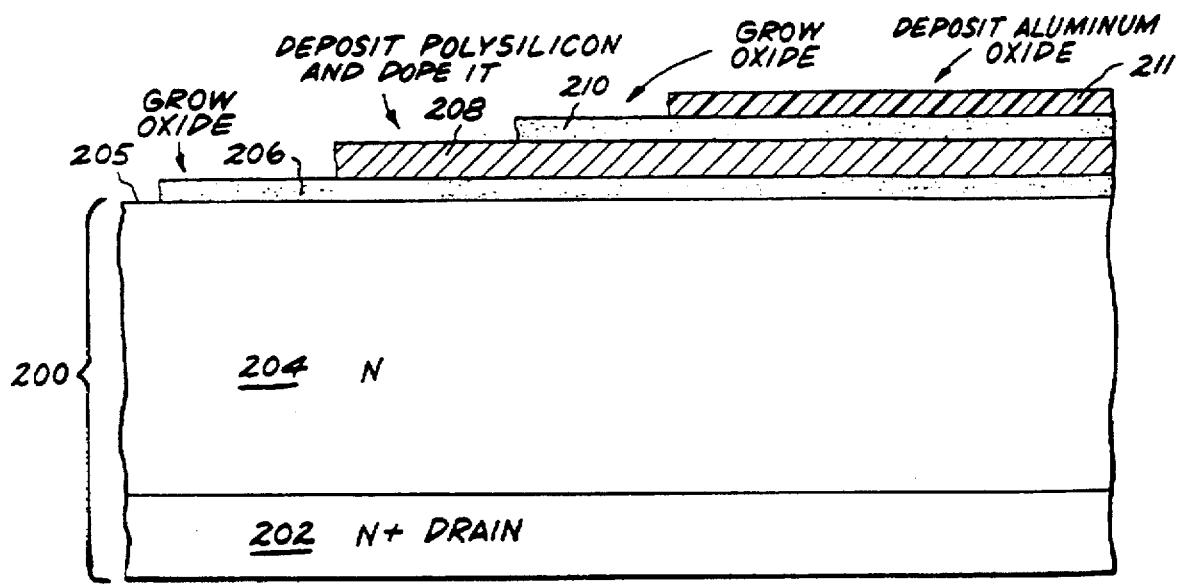
FIGS. 3A to 3D are cross sectional views showing the processing steps of a prior art patent for forming source regions in a DMOS transistor.
Figure 3B:
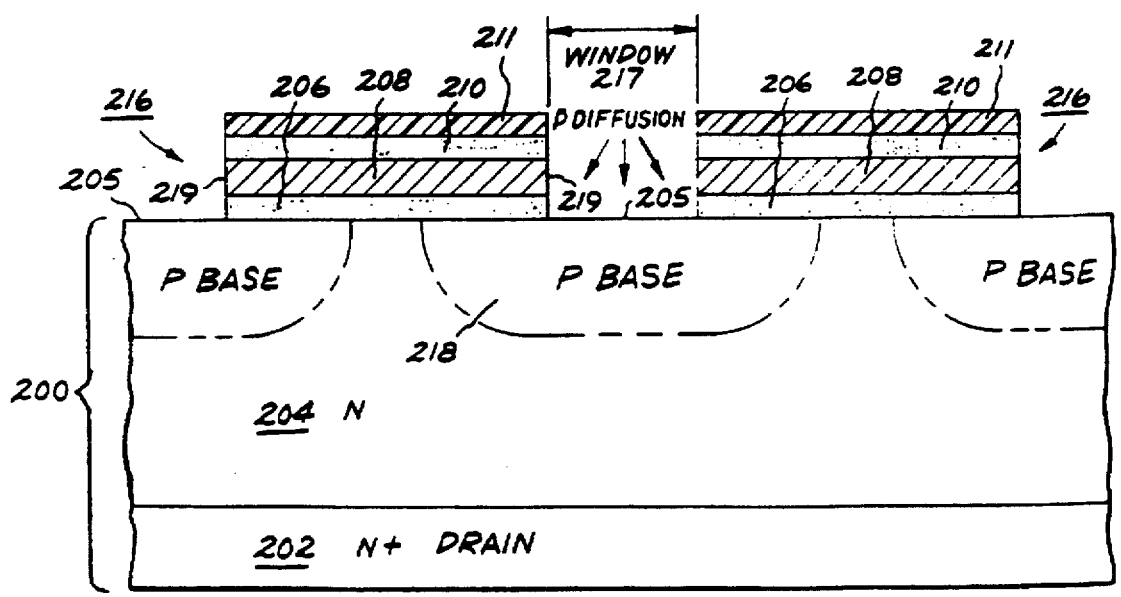
Figure 3C:
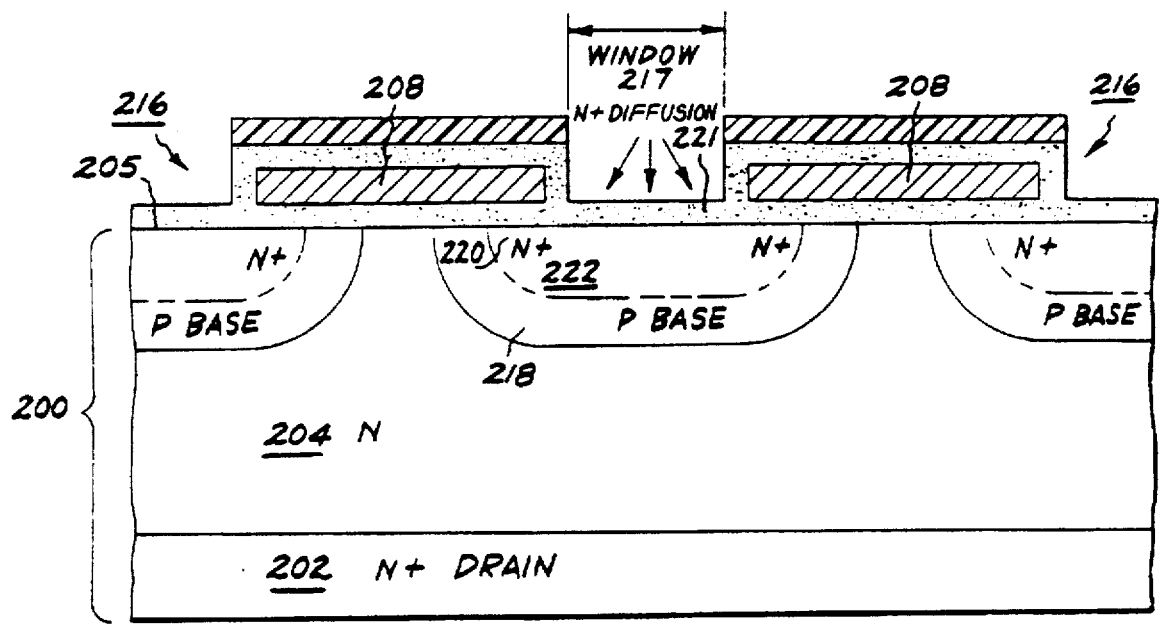
Figure 3D:
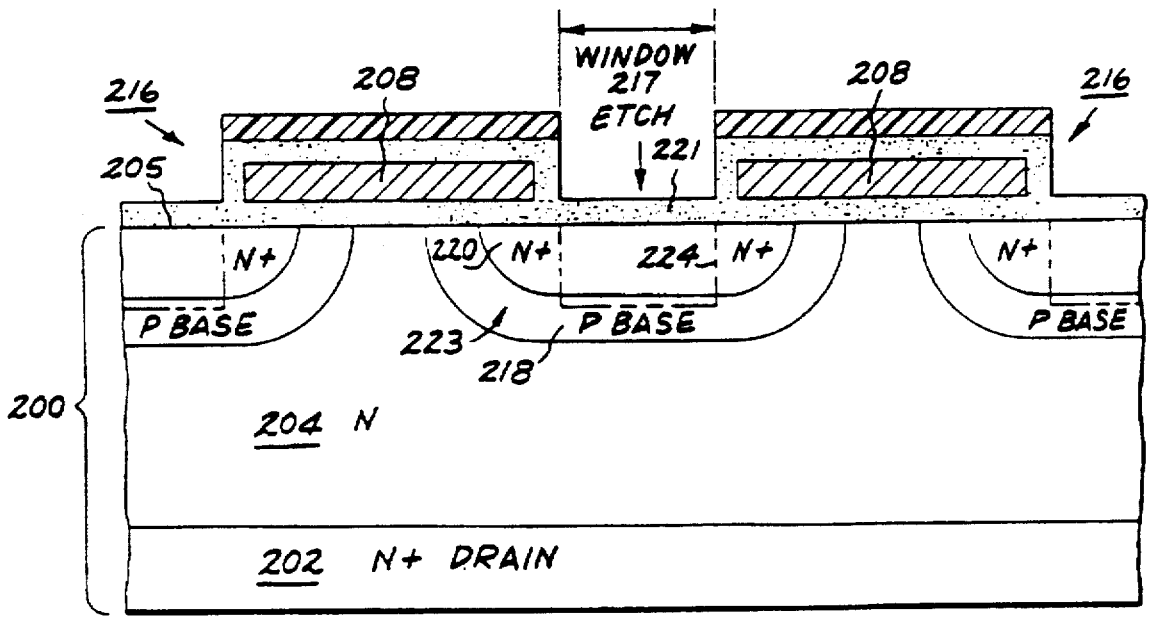
Figure 4A:
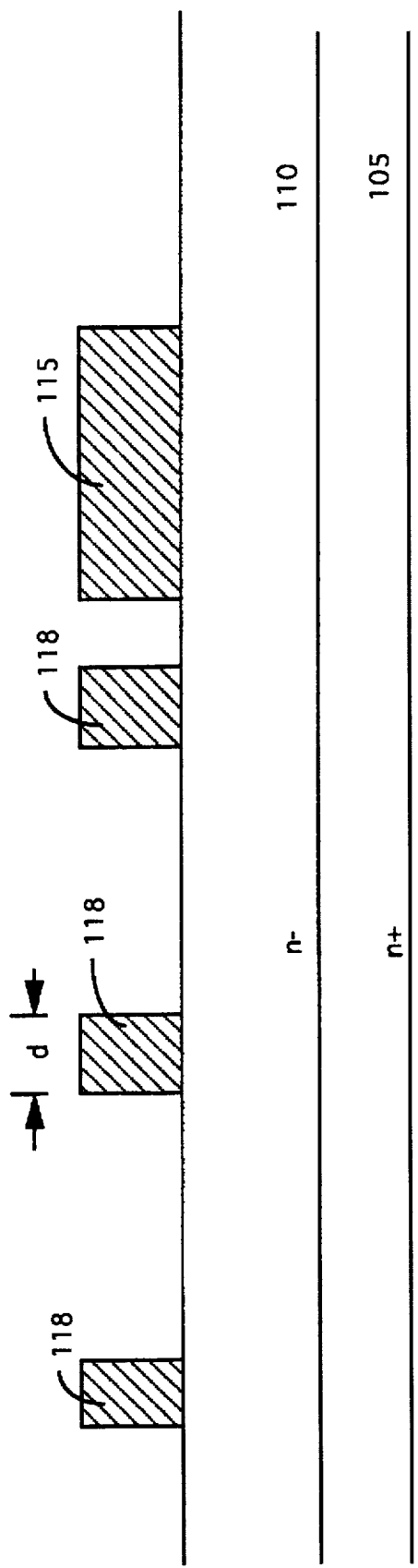

Please refer to FIGS. 4A to 4D for the processing steps in manufacturing the DMOS device 100. As shown in FIG. 4A, the processing steps begins by first growing a N- epitaxial layer 110 with a resistivity ranging from 0.1 to 10 ohm-cm on top of a N+ substrate 105. The substrate has a resistivity of 0.001 to 0.02 ohm-cm. The thickness and the resistivity of the epitaxial layer 110 depend on the device requirements for the on-resistance and breakdown voltage. In a preferred embodiment, the thickness of the epi-layer 110 is about six to eight microns. An initial oxide layer 115 of thickness in the range of 50 nm to 1.0 μm is grown. The thickness is chosen for the purpose of minimizing the parasitic effect as well as to block the implantation of the dopant in subsequent processing step as will be described below. The oxide layer 115 is then patterned by applying an active mask, i.e., the first mask, to define the active areas and a plurality of source-blocking "stumps" 118. The field oxide layer 115 is kept on the edge of the device area to form a termination area later in the fabrication processes. Additionally, different from the conventional fabrication processing method, a plurality of source-blocking stumps 118 are kept in source region (to be described later), as oxide pads, of the DMOS 100. The lateral dimension, i.e., d, of the blocking stumps is chosen to range between twice the lateral diffusion length of the source dopant, i.e., $2L_s$, and twice the lateral diffusion length of the body (channel) dopant, i.e., $2L_b$. The width d of the blocking stumps 118 can therefore be represented as:

$$2L_s \leq d \leq 2L_b \quad (1)$$

Figure 4B:
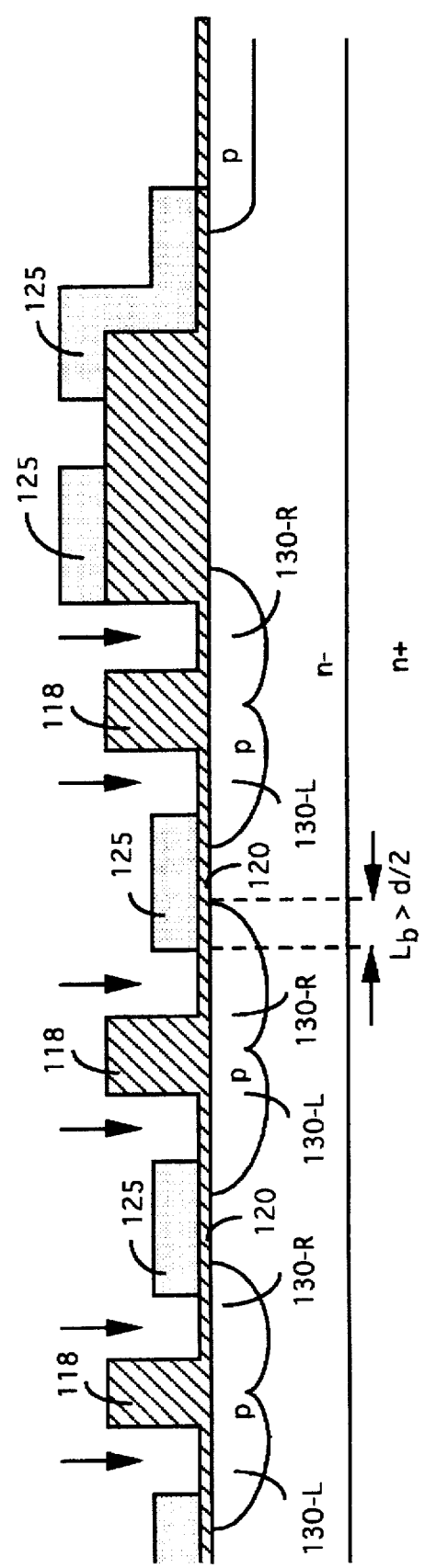

Please refer to FIG. 4B, a gate oxidation process is first carried out to form a gate oxide layer 120 which has a thickness ranging from 2 to 200 nm. A polysilicon layer 125 of thickness ranging from 200 to 1000 nm is then deposited on the gate oxide layer 120. A $POCL_3$ doping process is carried out followed by an arsenic (As) implant process with an ion beam of energy at 60–80 Kev with a flux density in the range between 5 to $8 \times 10^{15}/cm^2$. A poly mask, i.e., the second mask, is then applied to carry out the an anisotropic etching process to define the poly gate 125. A p-body implant at 30–100 Kev with an ion beam of $3 \times 10^{13}$ to $3 \times 10^{14}/cm^2$ flux density is applied to implant the p-body regions 130. The body implant is blocked by the thick oxide pads above the source region, i.e., the source-blocking stumps 118, initially two separate p-body regions 130-L and 130-R are formed on the left and the right of the blocking stump 118 respectively. The resist is then stripped and a p-body diffusion process is then carried out at an elevated temperature of 1,000°–1,200° C. for ten minutes to three hours to increase the depth of the p-body region 130 to 1.0–6.0 μm. Because the lateral dimension, i.e., the width d of the stump 118, is less than twice the lateral diffusion length of the body dopants, these two separate p- body regions are merged into a single p-body region 130 underneath the blocking stump 118 because of the lateral diffusion of the body dopants during the diffusion process. The transistor 100 thus includes a diffusion-merged p-body region 130 wherein the profile of the diffusion-merged p-body 130 has a wide-shallow W-profile as that shown in FIG. 4B.

Referring to FIG. 4C, applying the source blocking stumps 118 as source blocks, a $N^+$ implantation is carried out with an ion beam at an energy of 60–100 Kev and ion flux density of $5 \times 10^{15}$ to $1 \times 10^{16}/cm^2$ to form the source regions 140. Different from the conventional DMOS fabrication process, the source implant is performed without requiring a source mask. The $N^+$ source regions 140 are driven into desired junction depth ranging from 0.2 to 1.0μ by a diffusion process. Since the width d of the blocking stumps 118 exceed twice the diffusion length of the lateral diffusion length of the source dopants, the source regions are not merged underneath the blocking stumps 118.

Referring to FIG. 4D, a BPSG or PSG is deposited to form an insulating dielectric layer 145 of approximately 5000–15,000 Å in thickness. A BPSG flow or PSG densification process is performed at 900–950° C. for thirty minutes to one hour. A contact mask, ie., the third mask, is applied to perform an etching process through the PSG or BPSG layer 145 and the oxide layer 120 to define the contact windows. In this etching process, the blocking stumps 118 is also removed. A p+ ion implantation is carried out to form the p+ region 150 by a p+ activation process at 900°–950° C. in an oxidation or inert gas ambient. The final power DMOS device 100 is completed with the metal deposition and metal etching with a metal mask, i.e., the forth mask, to define the source contacts (S) 160, the gate contacts (G) 170, the field plate (FP) 180, and equal potential ring (EQR) 185. As an option, a pad mask, i.e., the fifth mask, is applied, if a passivation layer and pad patterning is required. Thus a four mask or five DMOS fabrication process is disclosed by applying a novel fabrication process which utilized specially patterned initial oxide layer with active mask to serve as a source implant blocking. A reduction in mask requirement is achieved. This improvement is accomplished because the fabrication process takes advantage of the difference in lateral diffusion lengths of the body dopants and the source dopants, and by employing a novel source implant blocking configuration to eliminate the requirement of a source blocking mask.

Figure 4E:
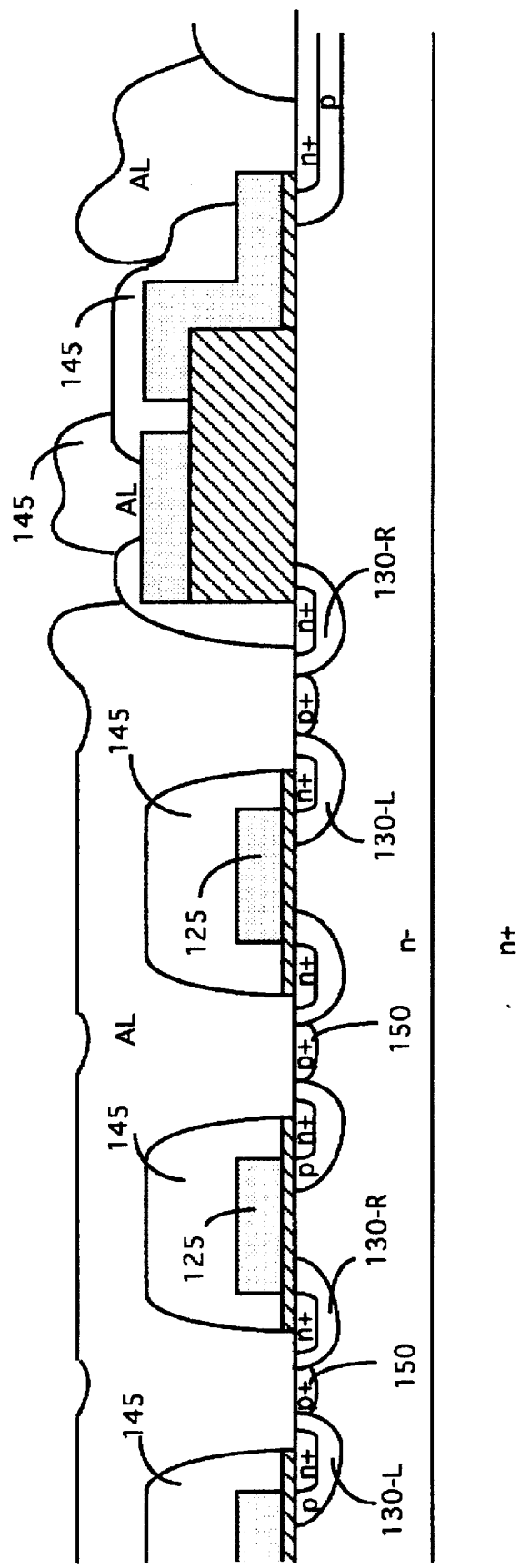
FIG. 4E shows another preferred embodiment of the present invention.

FIG. 4E shows another preferred embodiment where the p-body regions 130-L and 130-R are separated by a small distance when the left region 130-L and right regions 130-R are not merged by the lateral diffusion of these two regions during the p-body diffusion operation. A p+ implant will then form a bridging p+region between the left p-body region 130-L and the right p-body region 130-R to bridge the gap between these two regions.

Therefore, in a first preferred embodiment, the present invention includes a DMOS fabrication process for fabricating a DMOS transistor 100 on a substrate 105. The fabrication process includes the steps of (a) growing an oxide layer 115 on the substrate; (b) applying a first mask for removing the oxide layer to define an active area and for selectively patterning the oxide layer for keeping a plurality of source implant blocking stumps 118 near a plurality of source regions 140 in the substrate wherein the blocking stumps 118 being formed with width greater than twice a diffusion length of a source dopant and with width less than twice a diffusion length of the body dopant whereby the body regions merging together in the body diffusion and becoming a single body region underneath the blocking stumps; (c) applying a second mask for forming a plurality of gates 125 covering a portion of areas between the blocking stumps thus defining an implant window; (d) implanting a body dopant through the implant window followed by a body diffusion for forming a body region 130 underneath the blocking stumps; (d) implanting the source dopant through the implant window over the source implant blocking stumps following by a source diffusion for forming separate source regions 140 underneath the blocking stumps; (e) depositing an insulating dielectric BPSG/PSG layer 145; (f) employing a contact mask for etching through the insulating dielectric BPSG/PSG layer and the source implant blocking stumps to define contact windows; (g) depositing a metal layer to form a contact layer through the contact window; and (h) patterning the metal layer with a metal contact to define a plurality of contacts whereby the DMOS transistor 100 is fabricated with a four masks process.

Figure 5A:
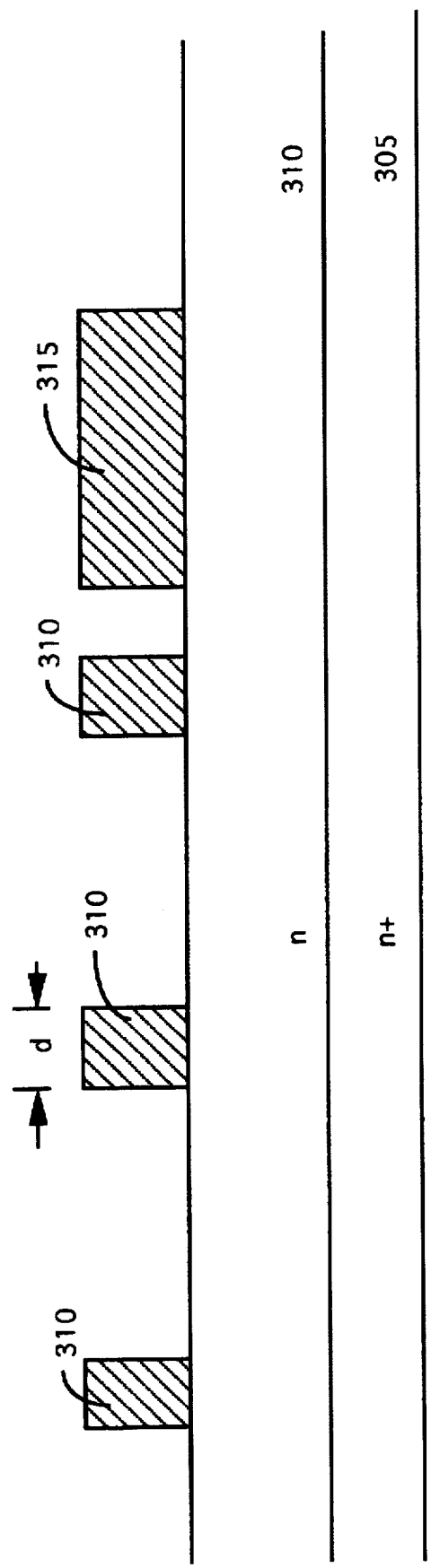
FIGS. 5A to 5G show the processing steps for manufacturing a trenched DMOS device of the present invention.

Please refer to FIGS. 5A to 5H for the processing steps for manufacturing a trenched DMOS device 300 of the present invention. As shown in FIG. 5A, the processing steps begins by first growing a N epitaxial layer 310 with a resistivity ranging from 0.1 to 10 ohm-cm on top of a N+ substrate 305. The substrate has a resistivity of 0.001 to 0.02 ohm-cm. The thickness and the resistivity of the epitaxial layer 310 depend on the device requirements for the on-resistance and breakdown voltage. In a preferred embodiment, the thickness of the epi-layer 310 is about three to twenty microns (3–20 µm). An initial oxide layer 315 of thickness in the range of 10 nm to 10 µm is grown. The thickness is chosen for the purpose of minimizing the parasitic effect as well as to block the implantation of the dopant in subsequent processing step as will be described below. The oxide layer 315 is then patterned by applying an active mask, i.e., the first mask, to define the active areas and a plurality of source-blocking "stumps" 318. The field oxide layer 315 is kept on the edge of the device area to form a termination area later in the fabrication processes. Additionally, different from the conventional fabrication processing method, a plurality of source-blocking stumps 318 are kept in source region (to be described later), as oxide pads, of the DMOS 300. The lateral dimension, i.e., d, of the blocking stumps is chosen to range between twice the lateral diffusion length of the source dopant, i.e., $2L_S$, and twice the lateral diffusion length of the body (channel) dopant, i.e., $2L_b$. The width d of the blocking stumps 318 can therefore be represented as that shown in Equation (1).

Figure 5B:
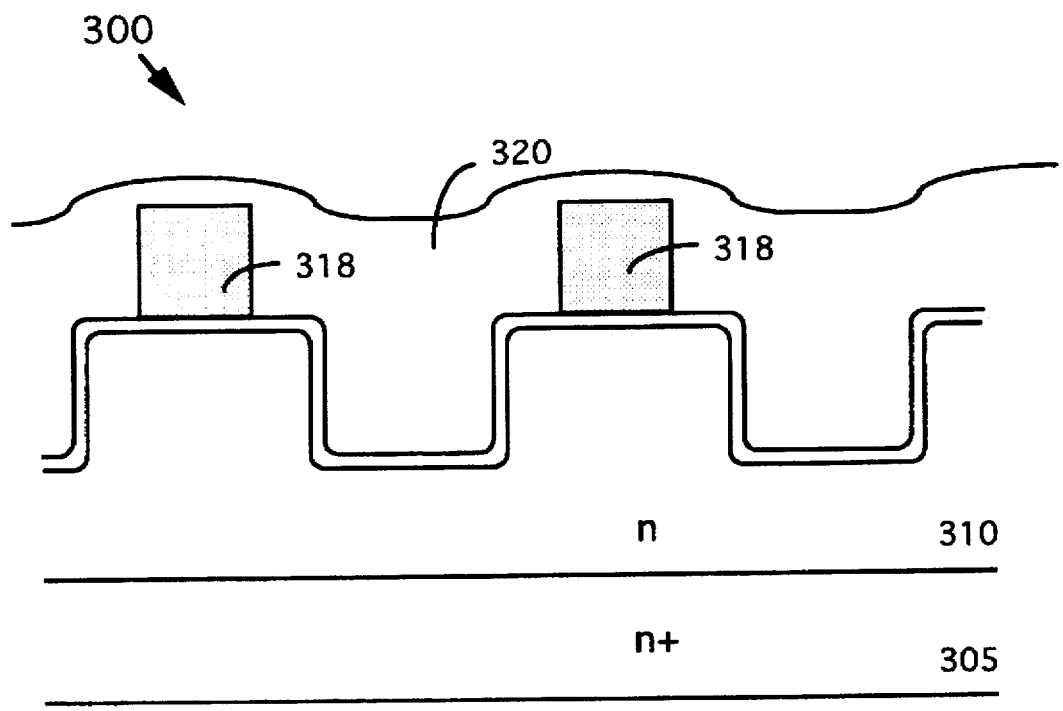
Figure 5C:
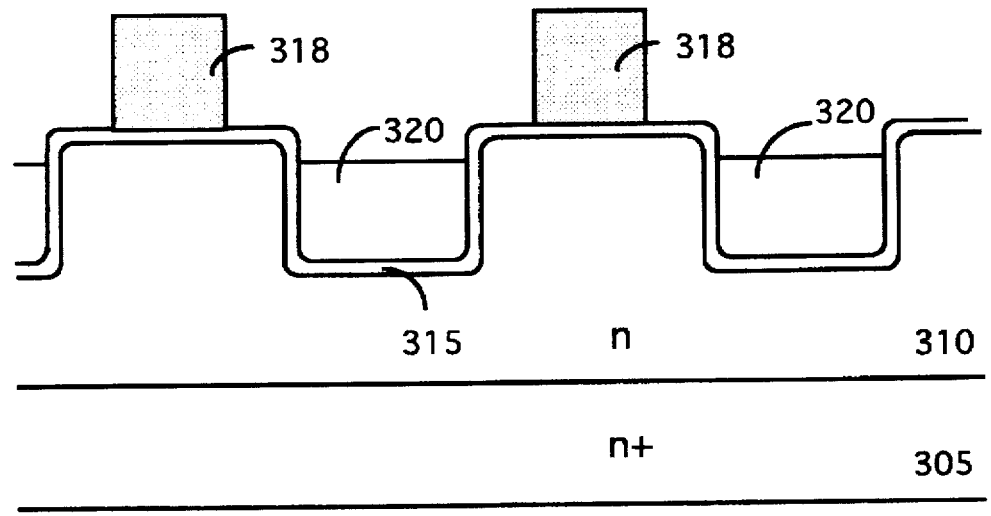

Referring to FIG. 5B, a photoresist is employed as a second mask, i.e., a trench mask. A trench etch process, which is a dry anisotropic etch process, is applied to form trenches of 1.0 to 2.0 microns and 1.0 to 2.0 micron in depth. A sacrification oxidation process is applied which can be either a dry or wet oxidation process conducted at a temperature of 900°–1100° C. to form oxide layer of approximately 300–2000 Å in thickness which is followed by a sacrification oxide etch process. A gate oxide layer 319 is then formed by a gate oxidation process which can be a wet or dry oxidation process carried out at a temperature of 800° to 1100° C. to form a layer of thickness in the range of 300 to 1,000 Å. A poly deposition process is performed to deposit a poly layer 320 ranging from 1.5 to 3.0 µ in thickness. A planarization etch is performed on the ploy layer 320 by etching a top layer to 0.2–0.4 µ from the deposited poly. A POCL$_3$ doping process is carried out at 950° C. to make the poly layer 320 have a sheet resistance of 20–40 ohm/cm$^2$. Referring to FIG. 5B, where a poly etch is carried out to dry etch the poly layer 320 till the top surface is removed while leaving the source blocking stumps 318 in place. The poly etch is performed with the end-point detection to terminate the etch process when the polysilicon layer 320 above the trench is removed.

Figure 5D:
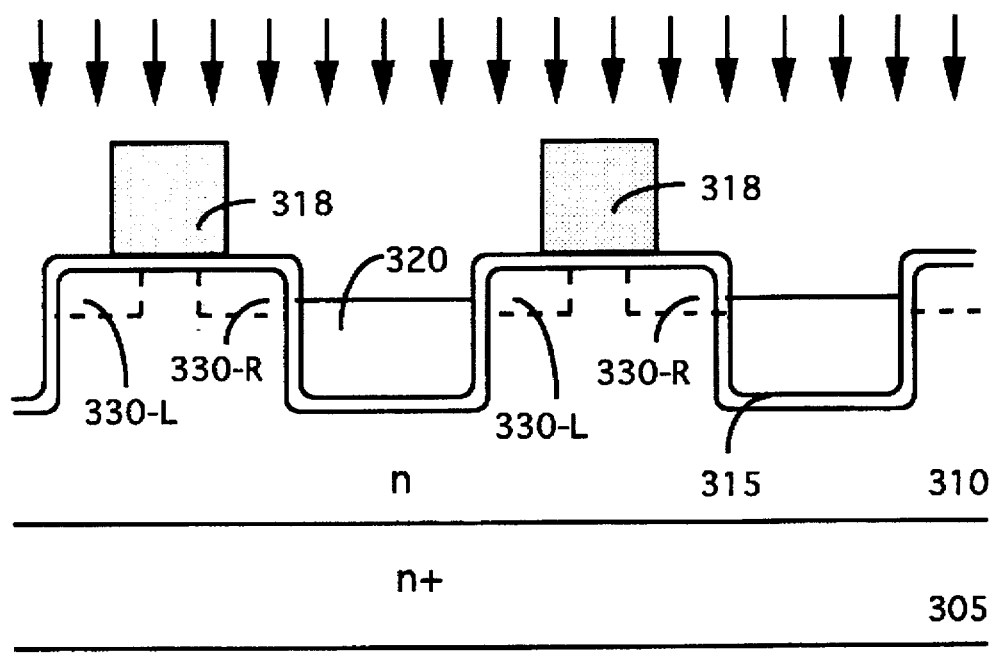
Figure 5E:
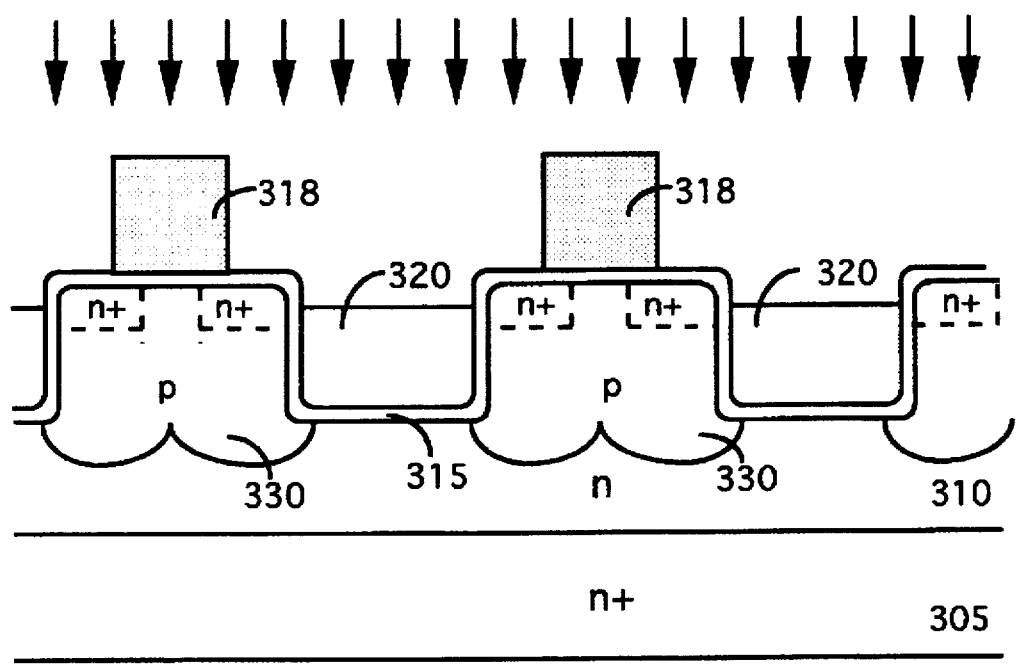
Figure 5F:
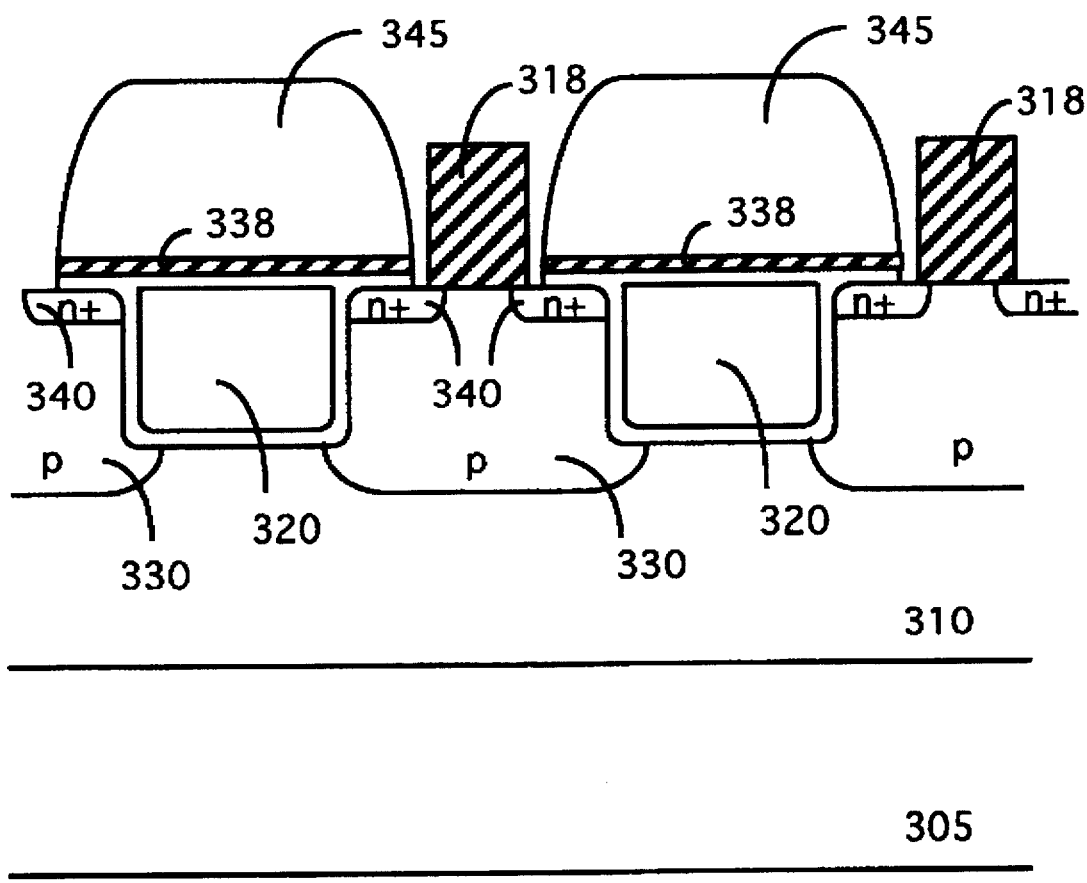

Referring to FIG. 5D, where a p-body implant with boron ions at 30–100 Kev with an ion beam of $2\times10^{13}$ to $2\times10^{14}$/cm$^2$ flux density is performed to form the p-body region 430. The body implant is blocked by the thick oxide pads 318 above the source region, i.e., the source-blocking stumps 318. Initially two separate p-body regions 330-L and 330-R are formed on the left and the right of the blocking stump 318 respectively. Referring to FIG. 5E, a p-body diffusion process is then carried out at an elevated temperature of 1,000°–1,200° C. for ten minutes to three hours to increase the depth of the p-body region 330 to 1.0–2.0 µ. Because the lateral dimension, i.e., the width d of the stump 318, is less than twice the lateral diffusion length of the body dopants, these two separate p- body regions are merged into a single p-body region 330 underneath the blocking stump 318 as a result of the lateral diffusion of the body dopants during the diffusion process. The transistor 300 thus includes a diffusion-merged p-body region 330 wherein the profile of the diffusion-merged p-body 330 has a wide-shallow W-profile as that shown in FIG. 5E.

The N+ implantation is carried out with an arsenic or phosphorus ion beam at an energy of 50–100 Kev and ion flux density of $5\times10^{15}$ to $1\times10^{16}$/cm$^2$. The source blocking stumps 318 serves as source implant blocks to carry out an N+ implant to form the N+ region 340. Different from the conventional DMOS fabrication process, the source implant is performed without requiring a source mask The N+ source regions 340 are driven into desired junction depth ranging from 0.2 to 1.0µ by a diffusion process at a temperature of 900°–1000° C. for 10 minutes to two hours. Since the width d of the blocking stumps 318 exceed twice the diffusion length of the lateral diffusion length of the source dopants, the source regions are not merged underneath the blocking stumps 318.

Figure 5G:
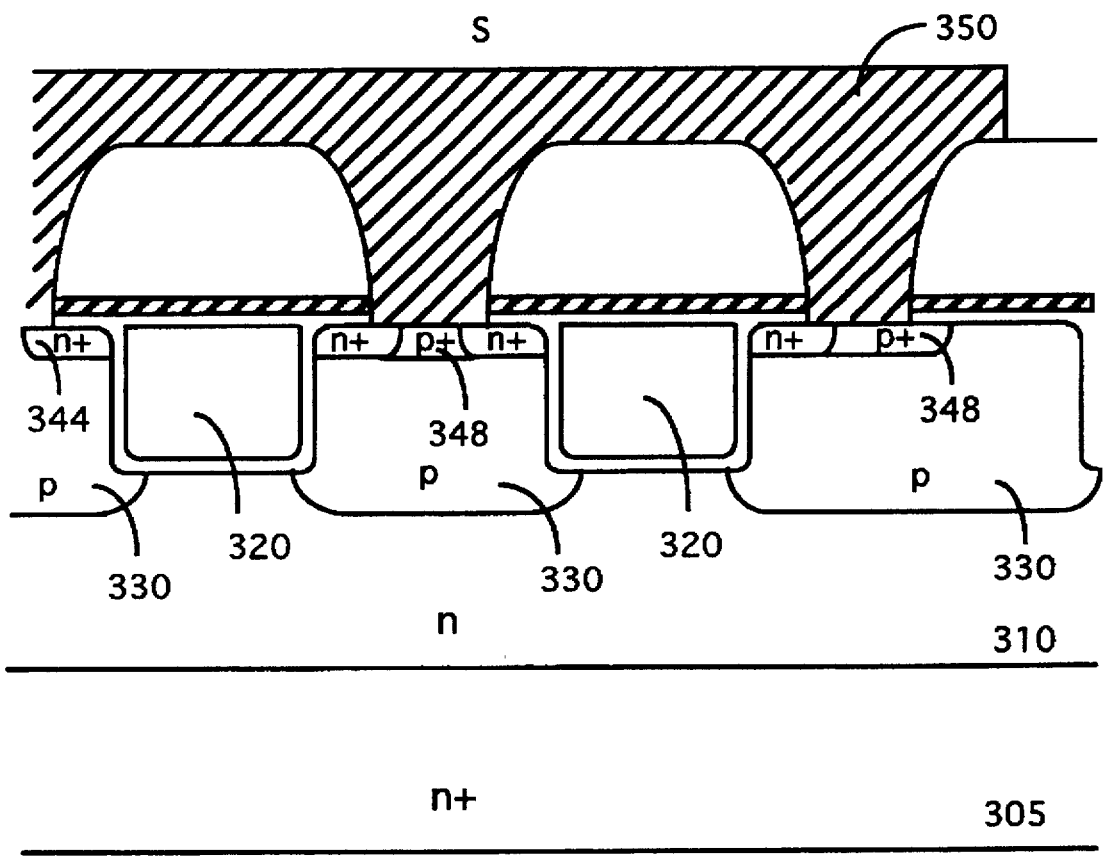

Referring to FIG. 5G, a low pressure chemical vapor deposition (LPCVD) nitride layer 338 is formed over the top surface. A BPSG or PSG is deposited to form a layer 345 of approximately 5000–15,000 Å in thickness. A BPSG flow or PSG densification process is performed at 900°–950° C. for thirty minutes to one hour. A contact mask, i.e., the third mask, is applied to perform an etching process through the PSG or BPSG layer 345 and the nitride layer 338 to define the contact windows. In this etching process, the blocking stumps 318 is also removed. The final power DMOS device 300 is completed with the metal deposition and metal etching with a metal mask, i.e., the forth mask, to define the source contacts, the gate contacts, the field plate, equal potential ring, and the channel stop. By the use of a nitride layer 338, a pad mask, i.e., the fifth mask, is not necessary since a passivation layer and pad patterning is no longer required. Thus a four mask DMOS fabrication process is disclosed by applying a novel fabrication process which utilized specially patterned initial oxide layer with active mask to serve as a source implant blocking. A reduction in mask requirement is achieved. This improvement is accomplished because the fabrication process takes advantage of 1). the difference in lateral diffusion lengths of the body dopants and the source dopants, 2). making use of a nitride protection layer 338, and 3) employing a novel source implant blocking configuration to eliminate the requirement of a source blocking mask.

In summary, a method for fabricating a trenched DMOS transistor 300 supported on a substrate 305 is also disclosed which comprises the steps of (a) growing an oxide layer 315 on the substrate; (b) applying a first mask for removing the oxide layer to define an active area and for selectively patterning the oxide layer for keeping a plurality of source implant blocking stumps 318 near a plurality source regions 340 in the substrate wherein the blocking stumps 318 being formed with width greater than twice a diffusion length of a source dopant; (c) applying a second mask for forming a plurality of trenches between the blocking stumps 318 and forming a gate 320 in each of the trenches thus defining a plurality of implant windows between the gates 320 and the blocking stumps 318; (d) implanting a body dopant through the implant window followed by a body diffusion for forming a body region 330 underneath the blocking stumps 318; and (e) implanting the source dopant through the implant window over the source implant blocking stumps following by a source diffusion for forming separate source regions 340 underneath the blocking stumps 318.

Therefore, the present invention provides an improved DMOS fabrication process to enable those of ordinary skill in the art of DMOS fabrication to reduce the number of masks such that the limitations encountered in the prior art can be overcome. Specifically, in this improved DMOS fabrication process, the requirement of applying a separate mask specifically for forming the source regions is eliminated such that the number of masks required to fabricate a DMOS transistor is reduced. This is accomplished by use of an active mask for patterning the initial oxide layer which is specially configured to form a plurality of source implant blocking stumps above the surface areas near the source regions for the purpose of eliminating the mask requirement in performing the source implant. Furthermore, the source implant blocking stumps patterned by the use of an active mask is specially designed to have an appropriate width less than twice the diffusion length of the body dopants while greater than twice the diffusion length of the source dopants. A body-merge can take place in body diffusion process to form an integral body underneath the source-block stumps while the source regions will not be merged underneath the blocking stumps during diffusion whereby the source regions can be formed with appropriate geometrical profile in the body regions. By applying the DMOS fabrication processes of this invention, a simplified fabrication method is therefore employed by reducing the number of masks thus reducing the cost of manufacture and meanwhile increasing the production yield-rate for DMOS fabrication.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A method for fabricating a DMOS transistor supported on a substrate comprising steps of:
   (a) growing an oxide layer on said substrate;
   (b) applying a first mask for removing said oxide layer to define an active area and for selectively patterning said oxide layer for keeping a plurality of source implant blocking stumps near a plurality of source regions in said substrate wherein said blocking stumps being formed with width greater than twice a diffusion length of a source dopant;
   (c) applying a second mask for forming a plurality of gates covering a portion of areas between said blocking stumps thus defining an implant window;
   (d) implanting a body dopant through said implant window followed by a body diffusion for forming body regions underneath said blocking stumps wherein said blocking stumps are patterned with width less than twice a diffusion length of said body dopant whereby said body regions merge together in said body diffusion and become a single body region underneath said blocking stumps; and
   (e) implanting said source dopant through said implant window over said source implant blocking stumps following by a source diffusion for forming separate source regions underneath said blocking stumps.

2. The method of fabricating said DMOS transistor as recited in claim 1 further comprising steps of:
   (f) depositing an insulating dielectric BPSG/PSG layer overlying said plurality of gates;
   (g) employing a contact mask for etching through said insulating dielectric BPSG/PSG layer and said source implant blocking stumps to define contact windows;
   (h) depositing a metal layer to form a contact layer through said contact window; and
   (i) patterning said metal layer with a metal contact to define a plurality of contacts whereby said DMOS transistor is fabricated with a four mask process.

3. The method of fabricating said DMOS transistor as recited in claim 1 wherein:
   said step (a) of growing an oxide layer on said substrate is a step of growing said oxide layer with thickness ranging from 10 nm to 10 μm.

4. A method for fabricating a DMOS transistor supported on a substrate comprising steps of:
   (a) growing an oxide layer on said substrate;
   (b) applying a first mask for removing said oxide layer to define an active area and for selectively patterning said oxide layer for keeping a plurality of source implant blocking stumps near a plurality of source regions in said substrate wherein said blocking stumps being formed with width greater than twice a diffusion length of a source dopant;
   (c) applying a trench mask to form a plurality of trenches on said substrate between said blocking stumps followed by forming a plurality of gates in said trenches;
   (d) implanting a body dopant through said implant window followed by a body diffusion for forming body regions underneath said blocking stumps wherein said blocking stumps are patterned with width less than twice a diffusion length of said body dopant whereby said body regions merge together in said body diffusion and become a single body region underneath said blocking stumps; and
   (e) implanting said source dopant through said implant window over said source implant blocking stumps following by a source diffusion for forming separate source regions underneath said blocking stumps;
   applying a trench mask to form a plurality of trenches on substrate between said blocking stumps followed by forming a plurality of gates in said trenches.

5. A method for fabricating a trenched DMOS transistor supported on a substrate comprising steps of:
   (a) growing an oxide layer on said substrate;
   (b) applying a first mask for removing said oxide layer to define an active area and for selectively patterning said oxide layer for keeping a plurality of source implant blocking stumps near a plurality of source regions in said substrate wherein said blocking stumps being formed with width greater than twice a diffusion length of a source dopant;
   (c) applying a second mask for forming a plurality of trenches between said blocking stumps and forming gates in said trenches thus defining a plurality of implant windows between said gates and said blocking stumps;
   (d) implanting a body dopant through said implant windows followed by a body diffusion for forming body regions underneath said blocking stumps; and
   (e) implanting said source dopant through said implant windows over said source implant blocking stumps following by a source diffusion for forming separate source regions underneath said blocking stumps.

6. The method of fabricating said trenched DMOS transistor as recited in claim 5 wherein:

said step (b) of applying said first mask for selectively patterning said oxide layer for keeping a plurality of source implant blocking stumps near a plurality of source regions is a step of patterning said blocking stumps with width less than twice a diffusion length of said body dopant whereby said body regions merge together in said body regions and become a single body region underneath said blocking stumps.

7. The method of fabricating said trenched DMOS transistor as recited in claim 6 further comprising steps of:

(f) depositing an insulating dielectric BPSG/PSG layer;

(g) employing a contact mask for etching through said insulating dielectric BPSG/PSG layer and said source implant blocking stumps to define contact windows;

(h) depositing a metal layer to form a contact layer through said contact window; and (i) patterning said metal layer with a metal contact to define a plurality of contacts whereby said DMOS transistor is fabricated with a four mask process.

* * * * *